United States Patent
Shimokura

(10) Patent No.: US 10,199,417 B2
(45) Date of Patent: Feb. 5, 2019

(54) STACKED-TYPE IMAGE SENSOR AND IMAGE CAPTURING APPARATUS

(71) Applicant: CANON KABUSHIKI KAISHA, Tokyo (JP)

(72) Inventor: Shintaro Shimokura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/176,642

(22) Filed: Jun. 8, 2016

(65) Prior Publication Data
US 2016/0373680 A1    Dec. 22, 2016

(30) Foreign Application Priority Data

Jun. 18, 2015 (JP) ................................. 2015-123109

(51) Int. Cl.
| | | |
|---|---|---|
| H01L 27/146 | (2006.01) | |
| H04N 5/369 | (2011.01) | |
| H04N 5/378 | (2011.01) | |

(52) U.S. Cl.
CPC ....... *H01L 27/14634* (2013.01); *H04N 5/369* (2013.01); *H04N 5/378* (2013.01)

(58) Field of Classification Search
CPC ...................... H04N 5/37455; H01L 27/14634
See application file for complete search history.

(56) References Cited

U.S. PATENT DOCUMENTS

| | | |
|---|---|---|
| 8,508,639 B2 | 8/2013 | Mabuchi et al. |
| 8,648,951 B2 | 2/2014 | Mabuchi et al. |
| 8,988,575 B2 | 3/2015 | Mabuchi et al. |
| 2006/0023109 A1* | 2/2006 | Mabuchi ................ H04N 5/335 348/340 |
| 2012/0293698 A1* | 11/2012 | Sukegawa .............. H04N 5/369 348/294 |
| 2014/0266418 A1* | 9/2014 | Huang .................... H01L 23/50 327/565 |
| 2015/0155325 A1 | 6/2015 | Mabuchi et al. |
| 2015/0163441 A1* | 6/2015 | Murata .................. H04N 5/378 348/308 |
| 2016/0014359 A1* | 1/2016 | Ota ...................... H04N 5/3696 348/223.1 |

FOREIGN PATENT DOCUMENTS

JP          2006-049361 A          2/2006

* cited by examiner

*Primary Examiner* — Gevell Selby
(74) *Attorney, Agent, or Firm* — Venable LLP

(57) ABSTRACT

A stacked-type image sensor has an imaging chip and a signal processing chip. The imaging chip includes a pixel unit in which a plurality of pixels are arranged, a plurality of output terminals provided so as to respectively correspond to the plurality of pixels, a first signal selection unit capable of inputting and outputting signals of pixels among the plurality of pixels, and a selection control unit that controls the first signal selection unit. The signal processing chip includes a plurality of input terminals electrically connected to the plurality of output terminals, a second signal selection unit capable of distributing and outputting signals that are input from the plurality of input terminals, and a signal processing circuit that performs predetermined signal processing on the signals distributed by the second signal selection unit.

9 Claims, 8 Drawing Sheets

STACKED-TYPE IMAGE SENSOR AND IMAGE CAPTURING APPARATUS

BACKGROUND OF THE INVENTION

Field of the Invention

The present invention relates to a stacked-type image sensor and an image capturing apparatus.

Description of the Related Art

In recent years, stacked-type image sensors in which an imaging chip is stacked on a signal processing chip have appeared as image sensors used in image capturing apparatuses such as a digital camera. In a stacked-type image sensor disclosed in Japanese Patent Laid-Open No. 2006-049361, one TSV (Through Silicon Via) is provided for every pixel or for a plurality of pixels, and pixel signals can be transmitted to a signal processing circuit via microbumps.

Currently, various sizes of image sensors such as 1/2.3 inches, 1 inch, and full size exist. Therefore, imaging chips having such various sizes have been developed for the stacked-type image sensors.

In contrast, in the case where there is an attempt to utilize a signal processing chip as a common part among imaging chips having different sizes, it can be presumed that connection terminals on the imaging chip will not correspond to connection terminals on a signal processing chip or the like, because the size of the signal processing chip is different from the size of the imaging chip.

SUMMARY OF THE INVENTION

The present invention has been made in consideration of the aforementioned problems, and realizes a stacked-type image sensor in which, even in a case where the size of an imaging chip is different from that of a signal processing chip, pixel signals can be properly read out from the imaging chip to the signal processing chip.

In order to solve the aforementioned problems, the present invention provides a stacked-type image sensor in which an imaging chip and a signal processing chip are stacked, wherein the imaging chip includes a pixel unit in which a plurality of pixels are arranged, a plurality of output terminals that are provided so as to respectively correspond to the plurality of pixels, a first signal selection unit that can input and output signals of pixels among the plurality of pixels by switching the signals, and a selection control unit that controls the first signal selection unit, and wherein the signal processing chip includes a plurality of input terminals that are to be electrically connected to the plurality of output terminals, a second signal selection unit that can distribute and output signals that are input from the plurality of input terminals, and a signal processing circuit that performs predetermined signal processing on the signals that have been distributed by the second signal selection unit.

In order to solve the aforementioned problems, the present invention provides an image capturing apparatus comprising: a stacked-type image sensor; and a control unit configured to control signal processing and capturing of an image by the stacked-type image sensor, wherein the stacked-type image sensor has an imaging chip and a signal processing chip which are stacked, the imaging chip includes a pixel unit in which a plurality of pixels are arranged, a plurality of output terminals that are provided so as to respectively correspond to the plurality of pixels, a first signal selection unit that can input and output signals of pixels among the plurality of pixels by switching the signals, and a selection control unit that controls the first signal selection unit, and the signal processing chip includes a plurality of input terminals that are to be electrically connected to the plurality of output terminals, a second signal selection unit that can distribute and output signals that are input from the plurality of input terminals, and a signal processing circuit that performs predetermined signal processing on the signals that have been distributed by the second signal selection unit.

According to the present invention, even in a case where the size of an imaging chip is different from that of a signal processing chip, pixel signals can be properly read out from the imaging chip to the signal processing chip.

Further features of the present invention will become apparent from the following description of exemplary embodiments (with reference to the attached drawings).

DESCRIPTION OF THE EMBODIMENTS

Embodiments of the present invention will be described in detail below. The following embodiments are merely examples for practicing the present invention. The embodiments should be properly modified or changed depending on various conditions and the structure of an apparatus to which the present invention is applied. The present invention should not be limited to the following embodiments. Also, parts of the embodiments to be described later may be properly combined.

Hereinafter, an embodiment in which the present invention is applied to an image sensor that is to be mounted on an image capturing apparatus such as a digital camera will be described. Note that the present invention can be applied to an electronic device such as a smartphone, which is a type of a cellular phone, and a tablet terminal, on which the image sensor is mounted.

Configuration of Image Sensor

A configuration of a stacked-type image sensor 100 will be described with reference to FIG. 1.

Figure 1:
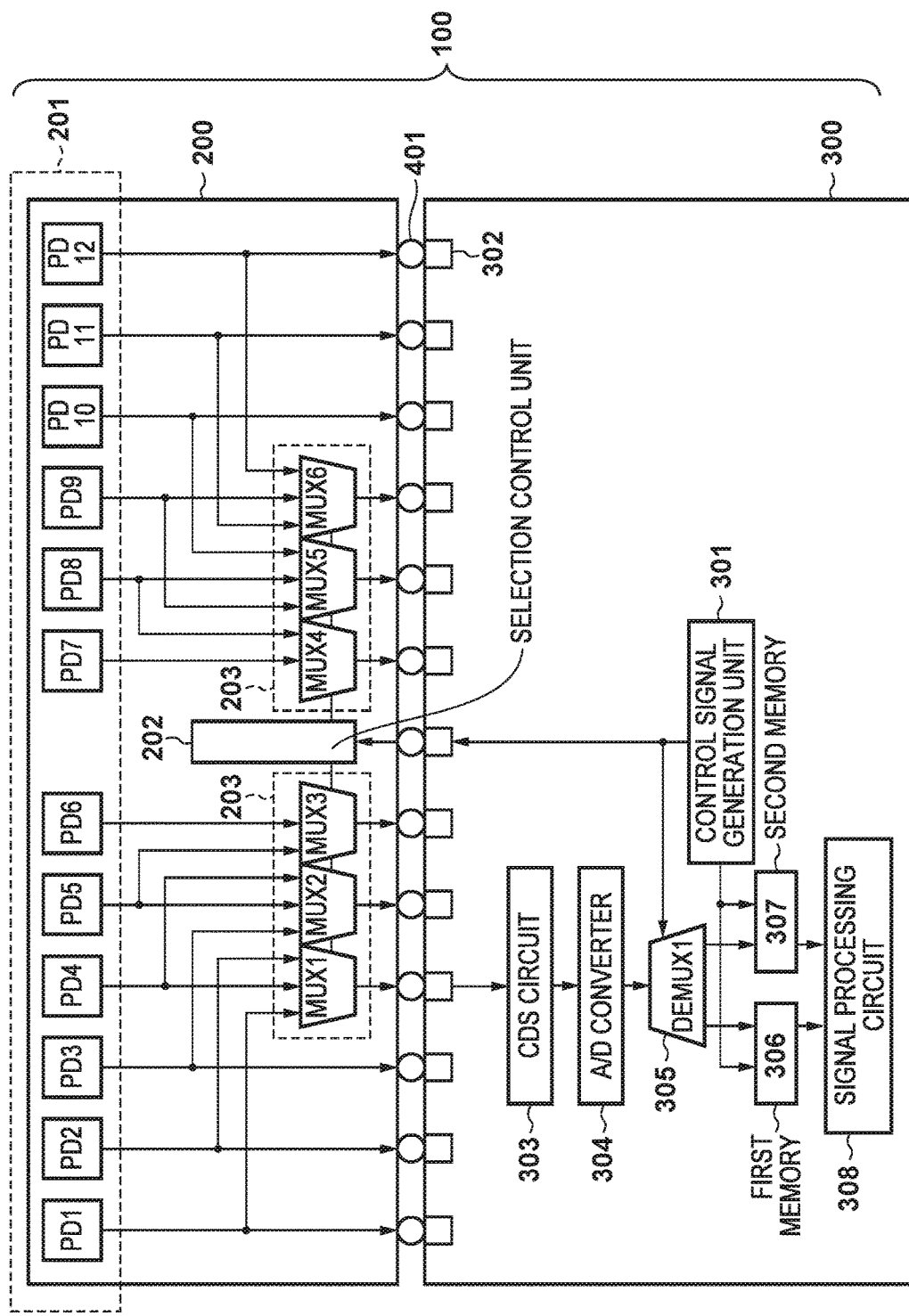
FIG. 1 is a block diagram illustrating a configuration of a stacked-type image sensor according to a present embodiment.

In FIG. 1, the stacked-type image sensor 100 is configured such that an imaging chip 200 constituted by an image capturing LSI (integrated circuit) is stacked on a signal processing chip 300 constituted by a signal processing LSI (integrated circuit). Pads 302 of the signal processing chip 300 are electrically connected to respective output terminals of the imaging chip 200 via respective microbumps 401.

The imaging chip 200 includes a pixel unit 201 (pixels PD1 to PD12), a first signal selection unit 203, and a selection control unit 202. Also, the imaging chip 200 includes a plurality of output terminals for outputting signals from the same pixels in the pixel unit 201 via a plurality of different paths. A plurality of pixels PD each including a photoelectric conversion element such as a photodiode having a light incident surface are arranged two-dimensionally in the pixel unit 201. The first signal selection unit 203 can input and output signals of pixels PD1 to PD12 in the pixel unit 201 by switching the signals, and includes multiplexers (MUX1 to MUX6), for example. The first signal selection unit 203 selectively inputs signals of at least two pixels PD, and outputs the input signals. The selection control unit 202 controls the first signal selection unit 203 to switch input/output of signals.

The signal processing chip 300 includes a control signal generation unit 301, a plurality of pads 302, a CDS circuit 303, an A/D converter 304, a second signal selection unit 305, a first memory 306, a second memory 307, and a signal processing circuit 308. The second signal selection unit 305 is a demultiplexer DEMUX1 that operates synchronously with the multiplexers MUX1 to MUX6, for example, and can output signals that are input from the multiplexers MUX1 to MUX6 to the first memory 306 and the second memory 307 by distributing the signals to the first memory 306 and the second memory 307.

The control signal generation unit 301 generates a control signal that is output to the selection control unit 202 that controls the first signal selection unit 203 in the imaging chip 200. Also, the control signal generation unit 301 generates a control signal for controlling the second signal selection unit 305. The control signals that are generated by the control signal generation unit 301 will be described in detail with reference to FIG. 5 and subsequent drawings. The pads 302 are provided so as to correspond to the plurality of input terminals of the signal processing chip 300, and are electrically connected to corresponding output terminals of the imaging chip 200 via respective microbumps 401. That is, the output terminals of the imaging chip 200 are electrically connected to the respective input terminals of the signal processing chip 300. The CDS circuit 303 performs correlated double sampling for removing a noise component such as reset noise included in an analog signal read out from the pixel unit 201 in the imaging chip 200.

The A/D converter 304 converts an analog signal from which noise has been removed by the CDS circuit 303 to a digital signal. The second signal selection unit 305 distributes signals that are output from the pixel unit 201 in the imaging chip 200 or the first signal selection unit 203 to the first memory 306 and the second memory 307, based on the control signal that is output from the control signal generation unit 301. The first memory 306 and the second memory 307 store digital signals that are output from the second signal selection unit 305, based on the control signal that is output from the control signal generation unit 301.

The signal processing circuit 308 performs color conversion processing, gamma correction processing, defective pixel correction processing, or the like on pixel data stored in the first memory 306 and the second memory 307 and generates image data based on a control signal that is output from the control signal generation unit 301. Also, the signal processing circuit 308 performs predetermined signal processing using the image data, and the processing result is used in AF (autofocus) processing, AE (auto exposure) processing, AWB (auto white balance) processing, or the like.

In FIG. 1, although the CDS circuit 303, the A/D converter 304, the second signal selection unit 305, the first memory 306, the second memory 307, and the signal processing circuit 308 are depicted for only an input terminal that corresponds to one pad 302 in the signal processing chip 300, a similar configuration is provided to each of the input terminals that correspond to other pads 302 (except for a pad 302 corresponding to the connection terminal of the control signal generation unit 301). That is, the CDS circuit 303, the A/D converter 304, the second signal selection unit 305, the first memory 306, the second memory 307, and the signal processing circuit 308 are provided.

Control of First Signal Selection Unit

Next, control of the first signal selection unit 203 by the selection control unit 202 of the present embodiment will be described with reference to FIGS. 2 and 3.

Figure 2:
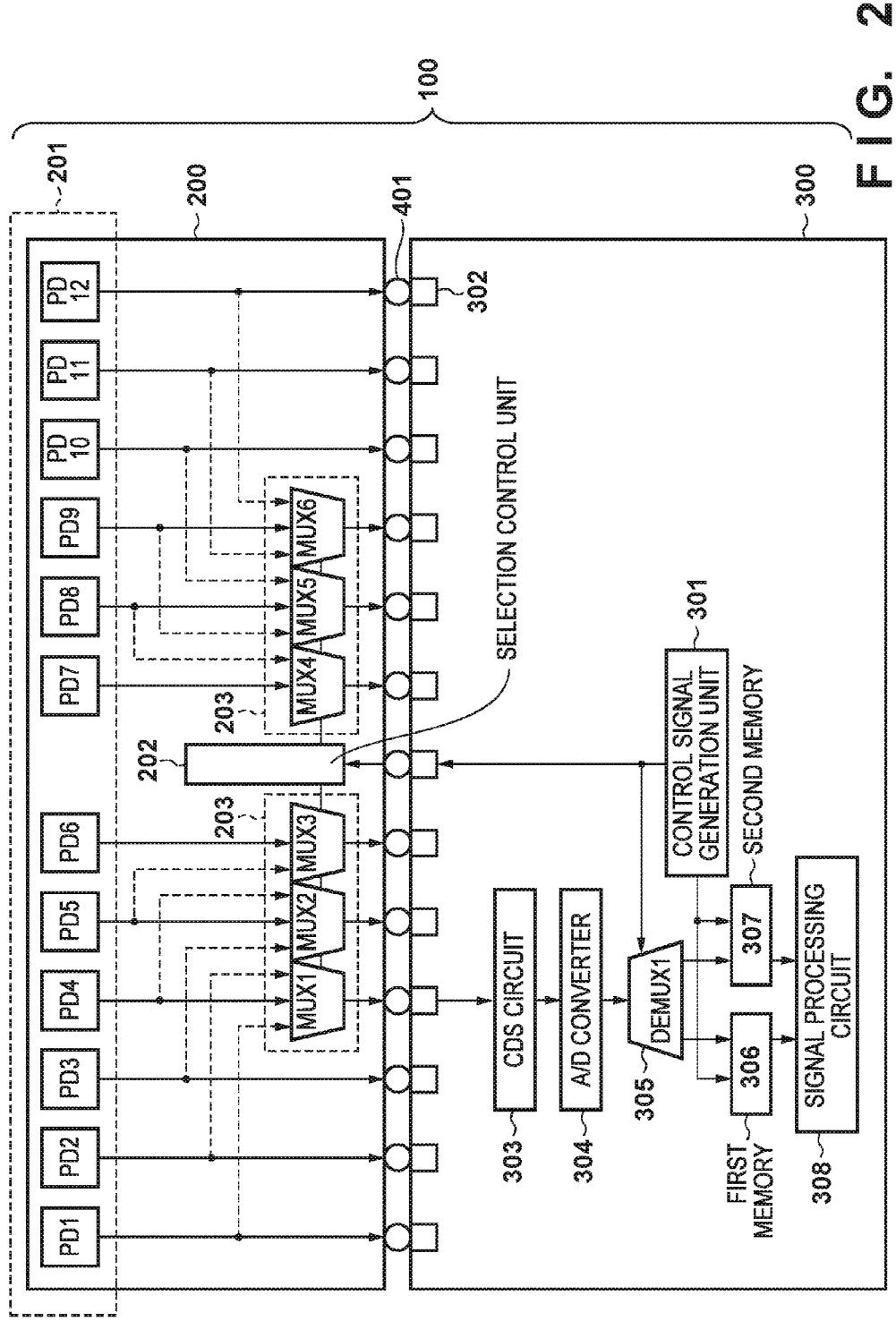
FIG. 2 is a block diagram illustrating a configuration in a case where sizes of the chips are substantially the same.

FIG. 2 is a diagram for describing the control of the first signal selection unit 203 in a case where the number of input terminals of the signal processing chip 300 is greater than or equal to the number of output terminals of the imaging chip 200. FIG. 3 is a diagram for describing the control of the first signal selection unit 203 in a case where the number of input terminals of the signal processing chip 300 is less than the number of output terminals of the imaging chip 200.

FIG. 2 illustrates a case where the chip size of the signal processing chip 300 is greater than or equal to that of the imaging chip 200, and the number of input/output terminals are the same. Therefore, signals of the pixels PD1 to PD12 are controlled so as to be output from the output terminals that respectively correspond to the pixels one-by-one. That is, in the control pattern in FIG. 2, the first signal selection unit 203 is controlled such that signal lines of pixels PD4 to PD9 indicated by solid lines are enabled, and signal lines of the pixels PD1 to PD5 and PD8 to PD12 indicated by broken lines are disabled. Such control can be implemented as a result of the selection control unit 202 controlling the first signal selection unit 203 based on the control signal output from the control signal generation unit 301 in the signal processing chip 300.

Figure 3:
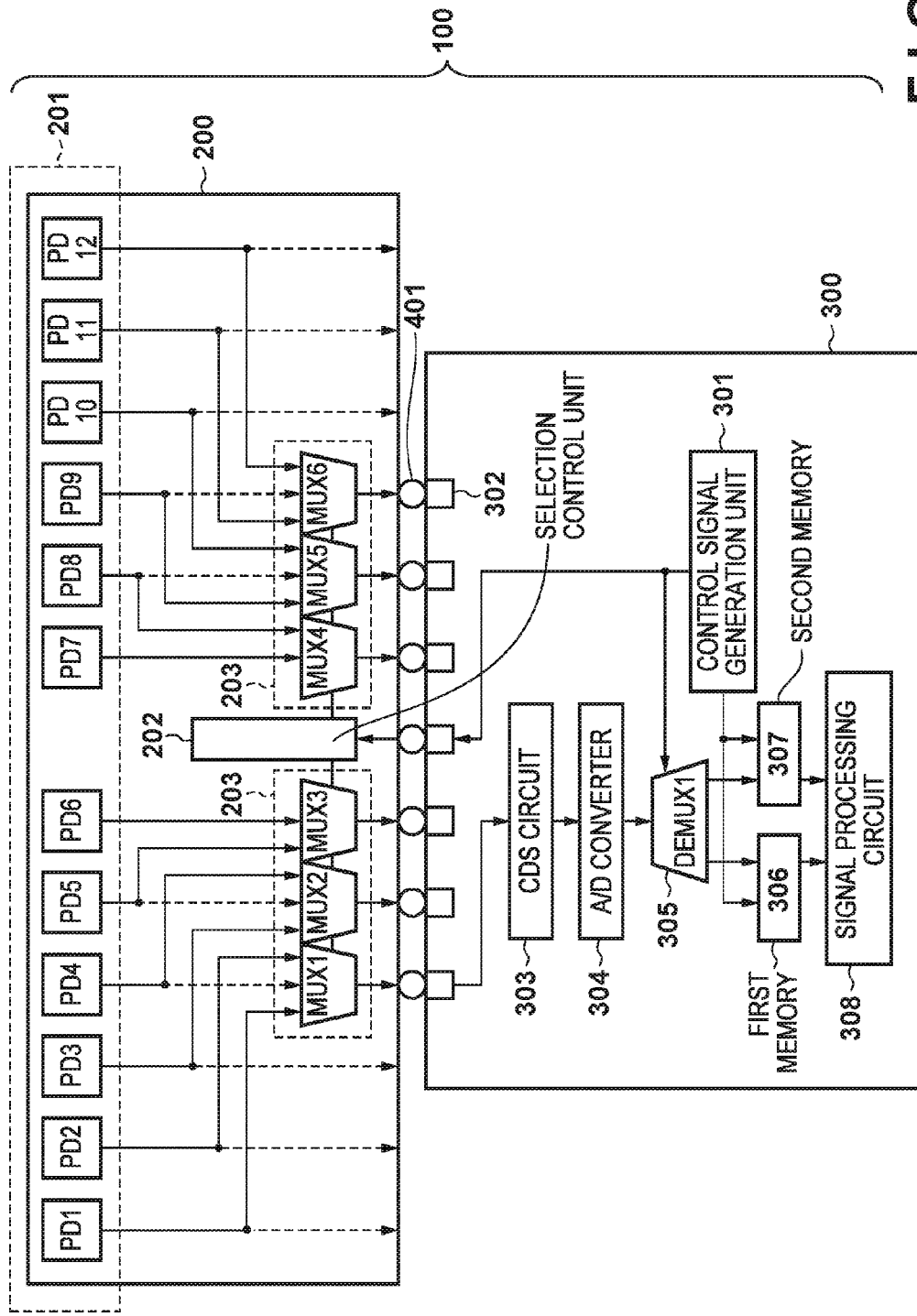
FIG. 3 is a block diagram illustrating a configuration in a case where sizes of the chips are different.

FIG. 3 illustrates a case where the chip size of the signal processing chip 300 is smaller than that of the imaging chip 200, and the number of input/output terminals of the signal processing chip 300 is less than that of the imaging chip 200. In this state, the number of input terminals of the signal processing chip 300 is insufficient with respect to the number of the output terminals of the imaging chip 200, and the input terminals cannot be connected to the pixels one-by-one. Accordingly, the first signal selection unit 203 in the imaging chip 200 is controlled so as to be able to input signals of the plurality of pixels (plurality of pixels adjacent to each other among the pixels PD1 to PD12, for example) by switching the signals of the plurality of pixels. Also, the first signal selection unit 203 is controlled such that signals of a plurality of pixels can be output from a single output terminal in the imaging chip 200. That is, in the control pattern in FIG. 3, the first signal selection unit 203 is controlled such that signal lines of pixels PD1 to PD12 indicated by solid lines are enabled, and signal lines of the pixels PD1 to PD5 and PD8 to PD12 indicated by broken lines are disabled. Such control can be implemented as a result of the selection control unit 202 controlling the first signal selection unit 203 based on the control signal output from the control signal generation unit 301 in the signal processing chip 300.

Note that, in the case where stacking the imaging chip 200 on the signal processing chip 300 as shown in FIG. 3 results in an unstable structure, gaps on both sides of the signal processing chip may be filled with silicone or the like at a time of packaging for stabilization.

In the present embodiment, when focusing on one pixel line in which the plurality of pixels PD1 to PD12 in the pixel unit 201 are arranged in one direction, outputs of a plurality of pixels that are adjacent to each other in the one pixel line are configured to be switched so as to able to be input to one multiplexer MUX in the first signal selection unit 203, as shown in FIG. 3.

Figure 4:
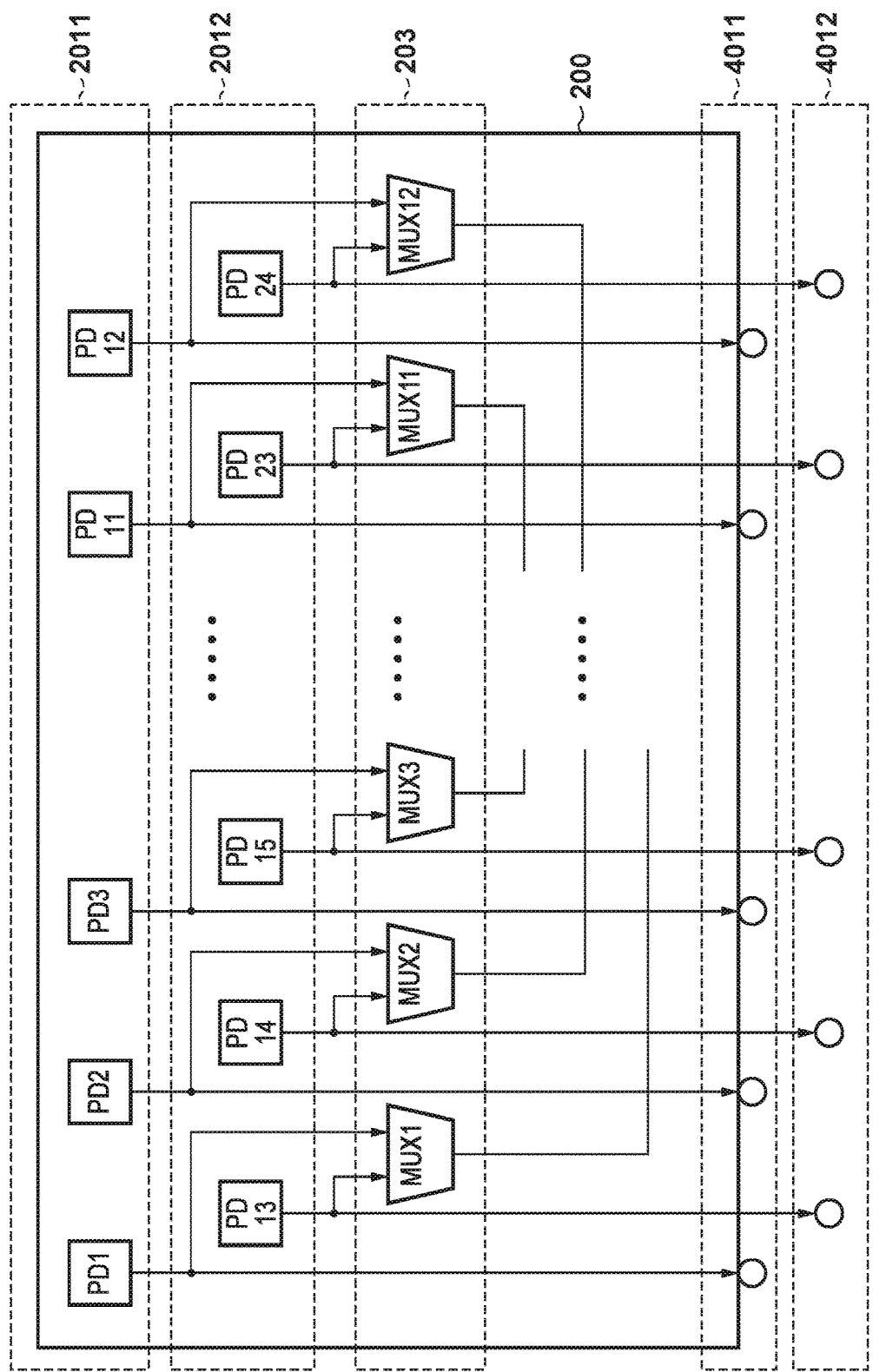
FIG. 4 is a block diagram illustrating a configuration in which signals of different pixel lines can be input.

FIG. 4 shows a circuit configuration in which outputs of two pixel lines (pixel line of pixels PD1 to PD12 and a pixel line of pixels PD13 to PD24) in the imaging chip 200 can be input to the first signal selection unit 203.

In FIG. 4, a pixel unit 2011 corresponds to the pixel line constituted by the pixels PD1 to PD12 in a first line, and a pixel unit 2012 corresponds to the pixel line constituted by the pixels PD13 to PD24 in a second line. Similarly, microbumps 4011 are microbumps in a first line, and microbumps 4012 are microbumps in a second line. As shown in FIG. 4, outputs of two pixels (pixels PD1 and PD13, for example) in the same column in two pixel lines adjacent to each other are configured to be input to a single MUX in the first signal selection unit 203.

Function of Control Signals

Next, the function of the control signals that are generated by the control signal generation unit 301 in the signal processing chip 300 of the present embodiment will be described with reference to FIG. 5.

Figure 5:
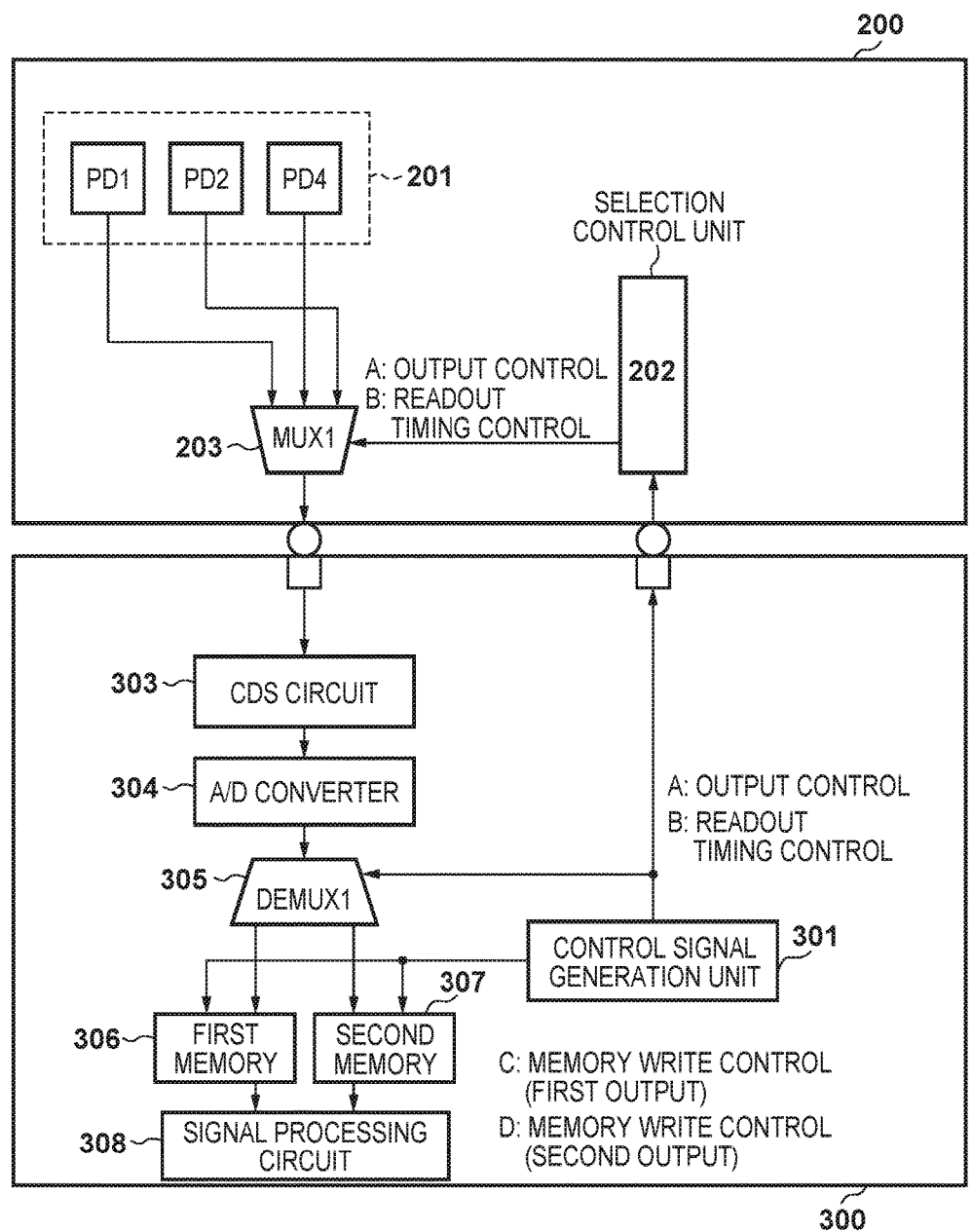
FIG. 5 is a block diagram illustrating a partial configuration shown in FIG. 1.

FIG. 5 illustrates a block diagram including control signals, when focusing on the multiplexer MUX1 in the first signal selection unit 203 shown in FIG. 1.

A control signal A is for performing control of switching input/output of signals in the first signal selection unit 203 (multiplexer MUX1) or the second signal selection unit 305 (demultiplexer DEMUX1). For example, in a state in which the control signal A is at a high level, a signal line of the pixel PD4 is enabled, and signal lines of the pixels PD1 and PD2 are disabled (a state in FIG. 2). In a state in which the control signal A is at a low level, the signal line of the pixel PD4 is disabled, and the signal lines of the pixels PD1 and PD2 are enabled (a state in FIG. 3).

A control signal B is for performing control of switching signal input/output of two pixels PD1 and PD2 in one pixel line by the multiplexer MUX1 in a state in which the control signal A is at a low level (the state in FIG. 3). Also, the control signal B is for performing control of distribution of two signals (signals of the pixels PD1 and PD2) that are output from the multiplexer MUX1 to the first memory 306 and the second memory 307 by switching between a first output and a second output of the demultiplexer DEMUX1 in the signal processing chip 300 synchronously with the multiplexer MUX1.

Control signals C and D are for performing control of writing of a signal of the first output of the demultiplexer DEMUX1 to the first memory 306 in the state in FIG. 2, and for performing control of distribution and writing of signals of the first output and the second output of the demultiplexer DEMUX1 to the first memory 306 and the second memory 307 in the state in FIG. 3.

Control Operation

Next, operations of the signal processing chip 300 based on the control signals that are generated by the control signal generation unit 301 of the present embodiment will be described with reference to FIGS. 6 and 7.

Figure 6:
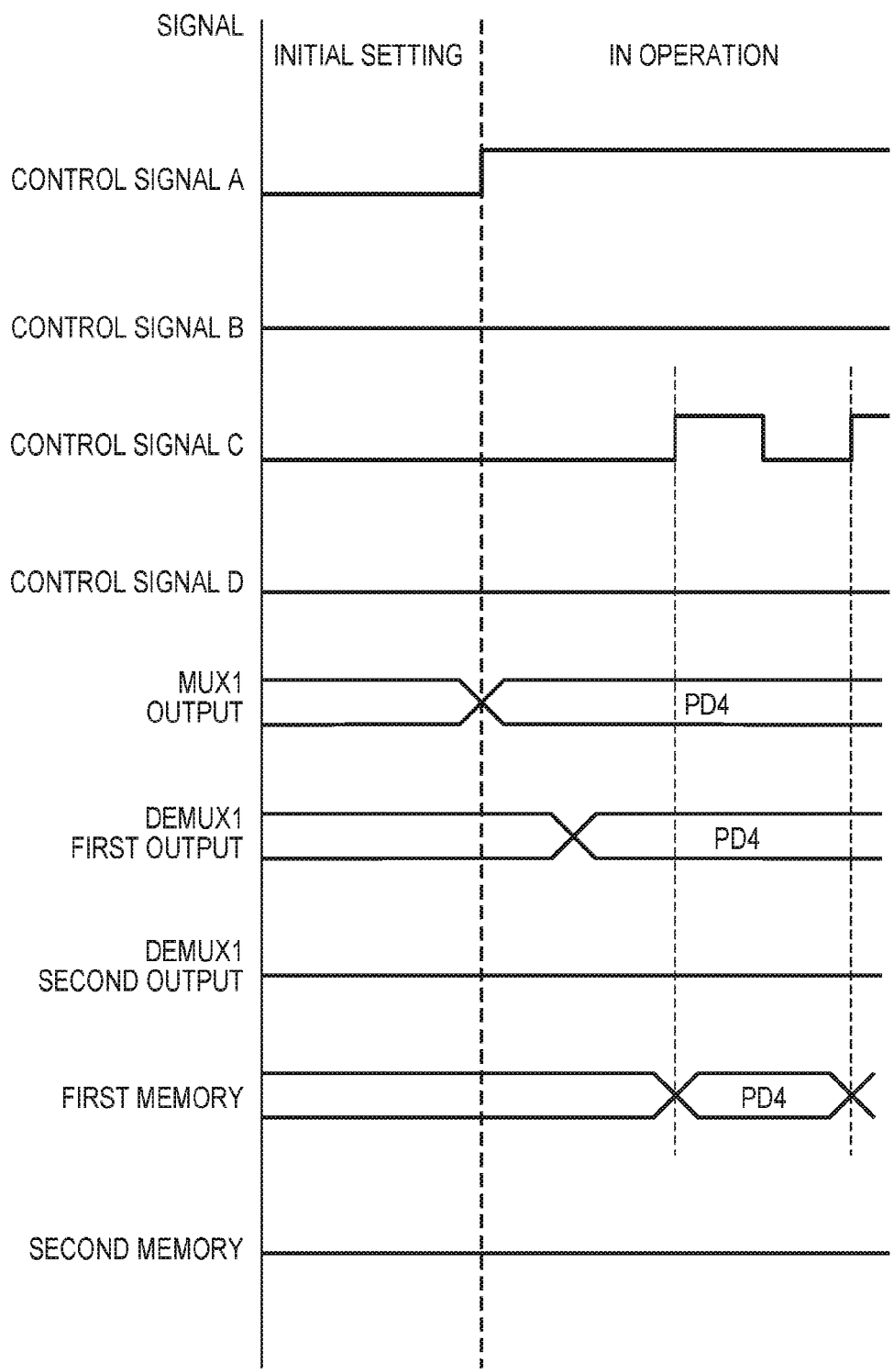
FIG. 6 is a timing chart illustrating an operation when a signal is read out in a control pattern shown in FIG. 2.

FIG. 6 illustrates the operation timing when signals are read out from the pixel unit 201 in FIG. 5 in the control pattern in FIG. 2. FIG. 7 illustrates the operation timing when signals are read out from the pixel unit 201 in FIG. 5 in the control pattern in FIG. 3.

As shown in FIG. 6, in the case where the chip sizes of the imaging chip 200 and the signal processing chip 300 are substantially the same, the control signal generation unit 301 outputs the control signals A and C at a time of initial setting. The multiplexer MUX1 is controlled at the time of initial setting with the control signal A, and a state is set in which outputs of the pixels PD1 and PD2 are disabled, and only an output of the pixel PD4 is enabled. The demultiplexer DEMUX1 is controlled with the control signal A and is set such that one of the first output and the second output (first output, for example) is enabled. The first memory 306 is controlled with the control signal C, and stores a signal of the first output of the demultiplexer DEMUX1. In the case of the control pattern in FIG. 2, the output of the pixel unit 201 in the imaging chip 200 is only a signal from the pixel PD4, and therefore the second memory 307 may not be used.

Figure 7:
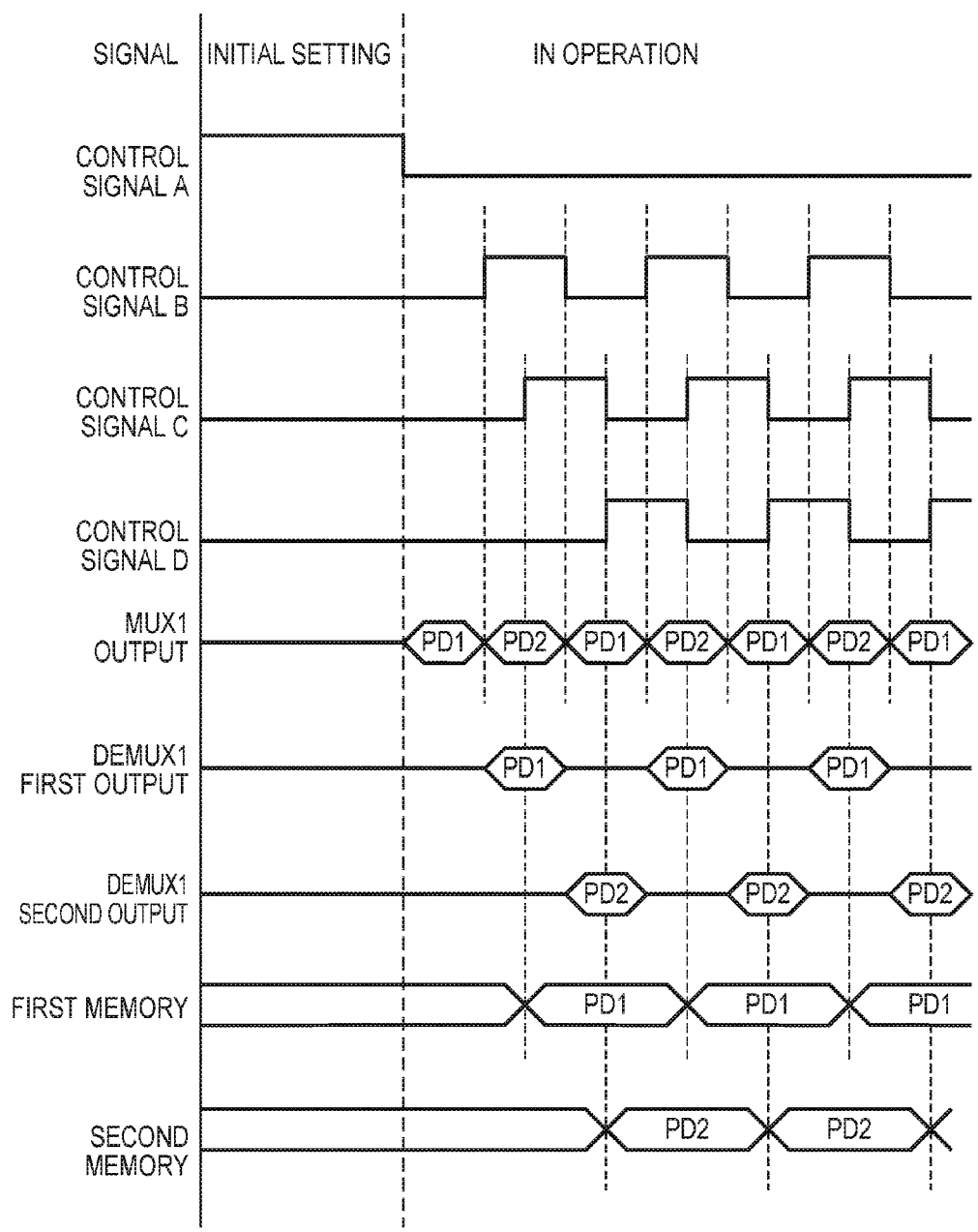
FIG. 7 is a timing chart illustrating an operation when a signal is read out in a control pattern shown in FIG. 3.

Next, as shown in FIG. 7, in the case where the imaging chip 200 is larger than the signal processing chip 300, the control signals A to D are output from the control signal generation unit 301 at the time of initial setting. The multiplexer MUX1 is controlled with the control signal A at the time of initial setting, and a state is set in which an output of the pixel PD4 is disabled and outputs of the pixels PD1 and PD2 are enabled. Also, the multiplexer MUX1 is controlled with the control signal B, and signals of the pixels PD1 and PD2 are switched so as to be sequentially input. The demultiplexer DEMUX1 is controlled with the control signal B, and signals that are input from the multiplexer MUX1 are switched to be sequentially output to one output (first output, for example) and the other output (second output, for example) so as to be distributed to the first memory 306 and the second memory 307. The first memory 306 is controlled with the control signal C, and stores a signal of the first output of the demultiplexer DEMUX1. The second memory 307 is controlled with the control signal D, and stores a signal of the second output of the demultiplexer DEMUX1.

As described above, according to the present embodiment, the first signal selection unit 203 in the imaging chip 200 is controlled with the control signals that are generated by the control signal generation unit 301 in the signal processing chip 300, and signals of the pixels are switched to be input. As a result of performing control in this way, even in a case where the number of input terminals of the signal processing chip 300 is insufficient with respect to the number of the output terminal in the imaging chip 200, pixel signals can be read out from all the pixels in the imaging chip 200.

Note that, although, in the present embodiment, two exemplary cases of the case where the size of the imaging chip 200 is substantially the same as that of the signal processing chip 300 and the case where the imaging chip 200 is larger than the signal processing chip 300 have been described, the present invention is not limited to these exemplary cases, and another control pattern may be added. Also, when the number of control patterns is increased, the area of the multiplexer MUX increases, and therefore control patterns of signal lines that can be input to the multiplexer MUX from the pixels in the imaging chip may be prepared in advance, and one of the control patterns that are prepared in advance may be arbitrarily selected, for example.

For example, in the case where an image (VGA) having the number of pixels that is sufficiently smaller than 16 million is to be captured by an imaging chip having 16 million pixels, information of all the pixels is not needed, and pixel information in which pixels are thinned out may suffice. In the example in FIG. 1, in the case where signals of a portion of the pixels in the pixel unit 201 are read out, such an operation can be realized by a configuration in which outputs of the pixels PD1, PD4, PD7, and PD10 are switched to be input to the first signal selection unit 203, and by changing the control signals that are generated by the control signal generation unit 301.

Also, although, in the present embodiment, all the pixels in the imaging chip 200 are read out at the same time or in a time division manner, signals can be read out without performing time-division processing even in a case in FIG. 3, because the number of pixel signals becomes less than the number of the connection terminals.

As described above, according to the present embodiment, even in a case where the size of the imaging chip 200 is larger than that of the signal processing chip 300, input/output of signals of the plurality of pixels are switched by the first signal selection unit 203 on the imaging chip 200 side in order to adapt to the signal processing chip 300 in which the number of connection terminals is insufficient. Accordingly, signals of all the pixels in the imaging chip 200 can be output to the signal processing chip 300 side.

Configuration of Image Capturing Apparatus

Next, an outline of the configuration and a function of an image capturing apparatus 50 to which the stacked-type image sensor 100 of the present embodiment is to be mounted will be described with reference to FIG. 8.

Figure 8:
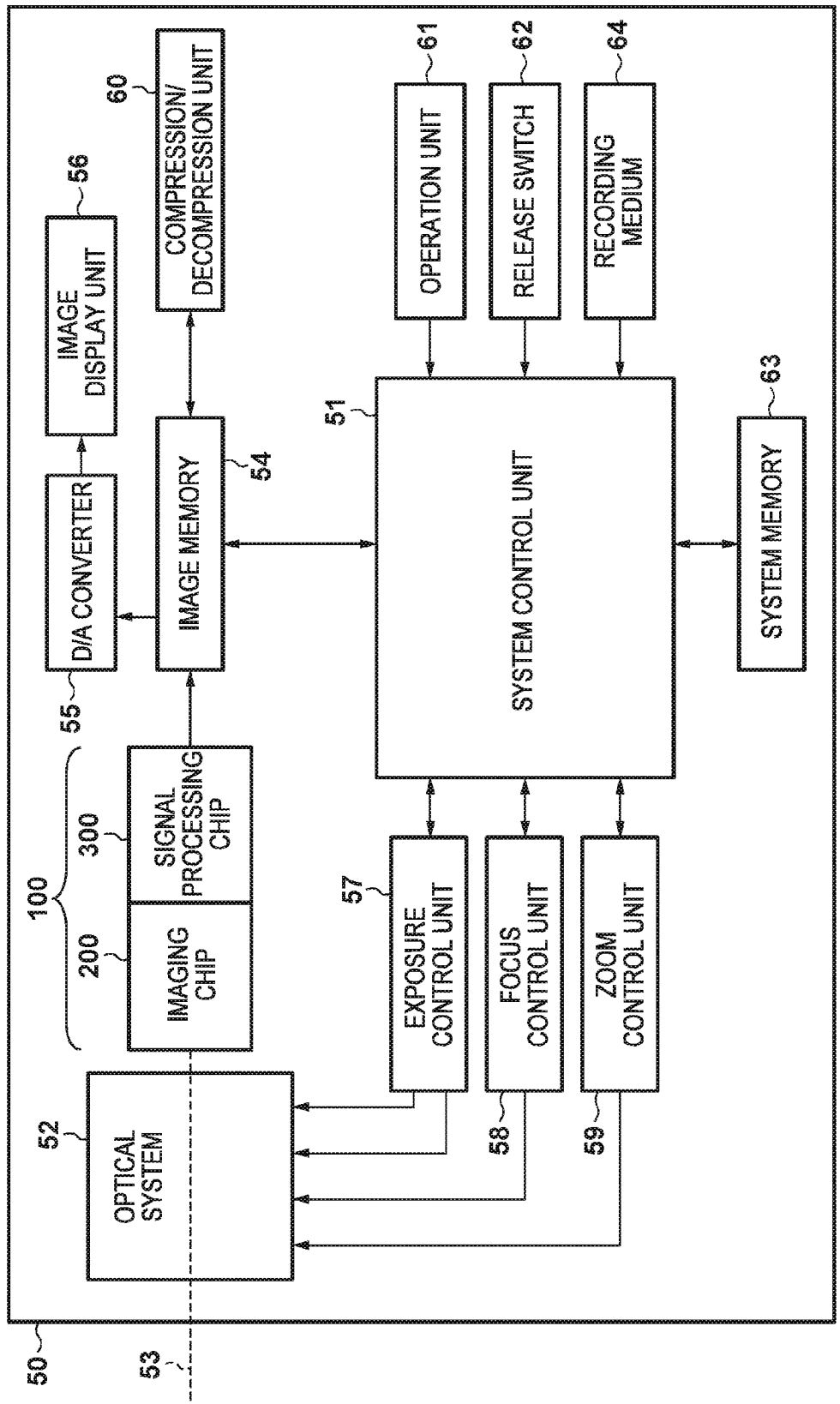
FIG. 8 is a block diagram illustrating an image capturing apparatus on which the image sensor of the present embodiment is to be mounted.

In FIG. 8, an optical system 52 includes a zoom lens, a focus lens, a shutter, a diaphragm, and the like. The imaging chip 200 included in the stacked-type image sensor 100 is arranged such that a light incident surface of the imaging chip 200 is located on an optical axis 53 of the optical system 52.

Image data that is generated by a signal processing circuit 308 in the signal processing chip 300 included in the stacked-type image sensor 100 is written into an image memory 54.

The image data written into the image memory 54 is displayed by an image display unit 56 via a D/A converter 55. The image display unit 56 is constituted by a TFT, an LCD, or the like, for example. Also, an electronic view finder function can be realized by consecutively displaying, using the image display unit 56, image data that has been captured.

Also, in the image display unit 56, in addition to an image being displayed, various menu items relating to various settings of the image capturing apparatus 50, shooting conditions such as a zoom ratio and an exposure setting, or the like are displayed along with an image being displayed, or without an image being displayed. A user can change a setting of a designated item by operating an operation unit 61 to appropriately select the menu items or the shooting conditions that are displayed in the image display unit 56 with.

A compression/decompression unit 60 is for compressing or decompressing image data using adaptive discrete cosine transformation (ADCT) or the like, reads image data stored in the image memory 54, performs compression processing or expansion processing on the image data, and again writes the processed data into the image memory 54.

The image memory 54 is for storing a still image or a moving image that has been captured, and has a sufficient memory capacity for storing a predetermined number of still images and a moving image having a predetermined time length. Also, the image memory 54 can be used as a work area for a system control unit 51.

An exposure control unit 57 controls the shutter and the diaphragm included in the optical system 52, a charge accumulation period in the stacked-type image sensor 100, and the like. A focus control unit 58 controls the focus lens included in the optical system 52. A zoom control unit 59 controls a zooming operation with the zoom lens included in the optical system 52.

A system memory 63 temporarily stores a constant, a variable, a program, and the like for operations of the system control unit 51. The system control unit 51 controls constituent elements of the overall image capturing apparatus 50.

An operation unit 61 has a function of inputting various operation instructions to the constituent elements that are controlled by the system control unit 51, and is configured by a switch, a dial, a touch panel, or the like, for example.

A release switch 62 can issue a shooting preparation instruction upon receiving a half-pressed operation, and issue a shooting instruction upon receiving a full-pressed operation. Upon receiving the shooting preparation instruction by the operation of the release switch 62, the system control unit 51 controls the constituent elements of the image capturing apparatus 50 such that shooting preparation operations such as AF (autofocus) processing and AE (auto exposure) processing are performed. Furthermore, upon receiving the shooting instruction, the system control unit 51 performs control such that an image of a subject is taken in with the stacked-type image sensor 100 by driving the shutter, the diaphragm, and the like with the exposure control unit 57.

The signal processing circuit 308 in the signal processing chip 300 that is included in the stacked-type image sensor 100 performs predetermined signal processing on a signal that is read out from the imaging chip 200, and generates image data. The generated image data is recorded in a recording medium 64 as an image file. A recording medium such as a hard disk or a flash memory having a sufficient capacity for recording a plurality of pieces of image data, is appropriate for the recording medium 64, for example.

Other Embodiments

Also, although, in the present embodiment, the structure in which the imaging chip 200 and the signal processing chip 300 are stacked is exemplified, the present invention is not limited thereto, and can be applied to a configuration in which other semiconductor integrated circuit chips between which signals are input and output are stacked.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-123109, filed Jun. 18, 2015 which is hereby incorporated by reference herein in its entirety.

What is claimed is:

1. A stacked-type image sensor comprising:
    an imaging chip that includes a pixel unit in which a plurality of pixels are arranged, a plurality of output terminals that are provided so as to respectively correspond to the plurality of pixels, a first signal selection unit that can selectively input signals of the plurality of pixels and output the input signals to the plurality of output terminals, and a selection control unit that controls the first signal selection unit; and
    a signal processing chip that includes a plurality of input terminals that are to be electrically connected to the plurality of output terminals, a second signal selection unit that can distribute and output signals that are input from the plurality of input terminals, a signal processing circuit that performs predetermined signal processing on the signals that have been distributed by the second signal selection unit, and a control signal generation unit that generates control signals for controlling the first signal selection unit arranged on the imaging chip and the second signal selection unit arranged on the signal processing chip,
    wherein the imaging chip includes an input terminal that inputs the control signals from the control signal generation unit of the signal processing chip, and the signal processing chip includes an output terminal that outputs the control signals from the control signal generation unit to the selection control unit of the imaging chip,
    wherein, in accordance with the control signals generated by the control signal generation unit that is arranged on the signal processing chip, the selection control unit controls the first signal selection unit arranged on the imaging chip to select which of the plurality of output terminals to output the output signals of the plurality of pixels, and
    wherein the imaging chip and the signal processing chip are stacked on each other.

2. The image sensor according to claim 1, wherein the plurality of pixels includes adjacent pixels that are included in the pixel unit.

3. The image sensor according to claim 1, wherein the plurality of pixels are pixels in a same column in the pixel unit.

4. The image sensor according to claim 1, wherein the signal processing chip further includes a plurality of memories for storing the signals that have been distributed by the second signal selection unit.

5. The image sensor according to claim 1, wherein the control signals include a signal with which the selection control unit controls timing at which the first signal selection unit inputs the signals of the plurality of pixels and timing at which the first signal selection unit outputs the signals.

6. The image sensor according to claim 5, wherein the signal processing chip further includes a plurality of memories for storing the signals that have been distributed by the second signal selection unit, and
    wherein the control signals include a control signal for controlling timing at which the signals that have been distributed by the second signal selection unit are to be stored to the plurality of memories.

7. A stacked-type image sensor comprising:
    an imaging chip that includes a pixel unit in which a plurality of pixels are arranged, a plurality of output terminals that are provided so as to respectively correspond to the plurality of pixels, and a first signal selection unit that can selectively input signals of the plurality of pixels and output the input signals to the plurality of output terminals; and
    a signal processing chip that includes a plurality of input terminals that are to be electrically connected to the plurality of output terminals, a second signal selection unit that can distribute and output signals that are input from the plurality of input terminals, a signal processing circuit that performs predetermined signal processing on the signals that have been distributed by the second signal selection unit, and a control signal generation unit that generates control signals for controlling the first signal selection unit arranged on the imaging chip and the second signal selection unit arranged on the signal processing chip,
    wherein the imaging chip includes an input terminal that inputs the control signals from the control signal generation unit of the signal processing chip, and the signal processing chip includes an output terminal that outputs the control signals from the control signal generation unit to the imaging chip,
    wherein, in accordance with the control signals generated by the control signal generation unit that is arranged on the signal processing chip, the first signal selection unit arranged on the imaging chip selects which of the plurality of output terminals to output the output signals of the plurality of pixels, and
    wherein the imaging chip and the signal processing chip are stacked on each other.

8. An image capturing apparatus comprising:
    a stacked-type image sensor; and
    a control unit configured to control signal processing and capturing of an image by the stacked-type image sensor,
    wherein the stacked-type image sensor has an imaging chip and a signal processing chip which are stacked,
    wherein the imaging chip includes a pixel unit in which a plurality of pixels are arranged, a plurality of output terminals that are provided so as to respectively correspond to the plurality of pixels, a first signal selection unit that can selectively input signals of the plurality of pixels and output the input signals to the plurality of output terminals, and a selection control unit that controls the first signal selection unit,
    wherein the signal processing chip includes a plurality of input terminals that are to be electrically connected to the plurality of output terminals, a second signal selection unit that can distribute and output signals that are input from the plurality of input terminals, a signal processing circuit that performs predetermined signal processing on the signals that have been distributed by the second signal selection unit, and a control signal generation unit that generates control signals for controlling the first signal selection unit arranged on the imaging chip and the second signal selection unit arranged on the signal processing chip, wherein the imaging chip includes an input terminal that inputs the control signals from the control signal generation unit of the signal processing chip, and the signal processing chip includes an output terminal that outputs the control signals from the control signal generation unit to the selection control unit of the imaging chip, and wherein, in accordance with the control signals generated by the control signal generation unit that is arranged on the signal processing chip, the selection control unit controls the first signal selection unit arranged on the imaging chip to select which of the plurality of output terminals to output the output signals of the plurality of pixels.

9. An image capturing apparatus comprising:

a stacked-type image sensor; and a control unit configured to control signal processing and capturing of an image by the stacked-type image sensor, wherein the stacked-type image sensor has an imaging chip and a signal processing chip which are stacked, wherein the imaging chip includes a pixel unit in which a plurality of pixels are arranged, a plurality of output terminals that are provided so as to respectively correspond to the plurality of pixels, and a first signal selection unit that can selectively input signals of the plurality of pixels and output the input signals to the plurality of output terminals, wherein the signal processing chip includes a plurality of input terminals that are to be electrically connected to the plurality of output terminals, a second signal selection unit that can distribute and output signals that are input from the plurality of input terminals, a signal processing circuit that performs predetermined signal processing on the signals that have been distributed by the second signal selection unit, and a control signal generation unit that generates control signals for controlling the first signal selection unit arranged on the imaging chip and the second signal selection unit arranged on the signal processing chip, wherein the imaging chip includes an input terminal that inputs the control signals from the control signal generation unit of the signal processing chip, and the signal processing chip includes an output terminal that outputs the control signals from the control signal generation unit the imaging chip, and wherein, in accordance with the control signals generated by the control signal generation unit that is arranged on the signal processing chip, the first signal selection unit arranged on the imaging chip selects which of the plurality of output terminals to output the output signals of the plurality of pixels.

* * * * *